(12) United States Patent
Lou et al.

(10) Patent No.: US 12,255,208 B2
(45) Date of Patent: Mar. 18, 2025

(54) DISPLAY PANEL AND DISPLAY APPARATUS

(71) Applicant: Shanghai Tianma Micro-Electronics Co., Ltd., Shanghai (CN)

(72) Inventors: Tenggang Lou, Shanghai (CN); Ximin Qi, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 191 days.

(21) Appl. No.: 17/931,683

(22) Filed: Sep. 13, 2022

(65) Prior Publication Data
US 2023/0005965 A1    Jan. 5, 2023

(30) Foreign Application Priority Data
Jun. 29, 2022   (CN) .......................... 202210760502.9

(51) Int. Cl.
G09G 3/32      (2016.01)
G11C 19/28     (2006.01)
H01L 27/12     (2006.01)

(52) U.S. Cl.
CPC ............. *H01L 27/124* (2013.01); *G09G 3/32* (2013.01); *G11C 19/287* (2013.01); *G09G 2310/0286* (2013.01); *G09G 2330/021* (2013.01)

(58) Field of Classification Search
CPC ....................................................... G09G 3/32
See application file for complete search history.

(56) References Cited

U.S. PATENT DOCUMENTS

2022/0005886 A1* 1/2022 Jeong .................. G09G 3/2092
2023/0033702 A1* 2/2023 Feng ..................... H01L 27/124

FOREIGN PATENT DOCUMENTS

| CN | 109698226 A | 4/2019 |
|---|---|---|
| CN | 110265454 A | 9/2019 |
| CN | 110515249 A | 11/2019 |
| CN | 113554969 A | 10/2021 |

OTHER PUBLICATIONS

Office Action mailed Apr. 22, 2024, issued in corresponding Chinese Application No. 202210760502.9, filed Jun. 29, 2022, 15 pages.

\* cited by examiner

*Primary Examiner* — Joseph R Haley
(74) *Attorney, Agent, or Firm* — CHRISTENSEN O'CONNOR JOHNSON KINDNESS PLLC

(57) ABSTRACT

A display panel including a display region including first and second display regions, and sub-pixels in the display region, data lines electrically connected to the sub-pixels and including first data lines in the first display region and second data lines located in the second display region; a shift register in the first display region and including cascaded shift units, each shift unit being divided into at least two sub-units, and one sub-unit being located at a side of one sub-pixel connecting lines electrically connected to the sub-units of the shift units, one of the first data lines overlapping with one of the connecting lines in a direction perpendicular to a plane of the display panel; and compensation structures located in the second display region, and each overlapping with at least one of the second data lines in the direction.

14 Claims, 12 Drawing Sheets

DISPLAY PANEL AND DISPLAY APPARATUS

CROSS-REFERENCE TO RELATED APPLICATIONS

The present application claims priority to Chinese Patent Application No. 202210760502.9, filed on Jun. 29, 2022, the content of which is incorporated herein by reference in its entirety.

TECHNICAL FIELD

The disclosure relates to a technical field of displaying, in particular to a display panel and a display apparatus.

BACKGROUND

Light Emitting Diode (LED) display panels are widely used in various electronic devices due to their advantages of self-illumination, low driving voltage, high luminous efficiency, short response time, high definition, and contrast.

In recent years, narrow bezel designs of display panels have developed as a trend. Accordingly, there is an urgent need to optimize display performance of a display panel with a narrow bezel or even borderless design.

SUMMARY

In an aspect, a display panel is provided in some embodiments of the present disclosure. The display panel has a first display region and a second display region. The display panel includes sub-pixels located in the display region, data lines electrically connected to the sub-pixels, a shift register, connecting lines, and compensation structures. The data lines include first data lines located in the first display region and second data lines located in the second display region. The shift register is located in the first display region and includes cascaded shift units, each of the shift units is divided into at least two sub-units, and one of the at least two sub-units is located at a side of one of the sub-pixels. The connecting lines are electrically connected to the sub-units of the shift units, and one of the first data lines overlaps with one of the connecting lines in a direction perpendicular to a plane of the display panel. The compensation structures are located in the second display region, and each overlap with at least one of the second data lines in the direction perpendicular to the plane of the display panel.

In another aspect, a display apparatus is provided in some embodiments of the present disclosure, includes a display panel. The display panel has a first display region and a second display region. The display panel includes sub-pixels located in the display region, data lines electrically connected to the sub-pixels, a shift register, connecting lines, and compensation structures. The data lines include first data lines located in the first display region and second data lines located in the second display region. The shift register is located in the first display region and includes cascaded shift units, each of the shift units includes at least two sub-units, and one of the at least two sub-units is located at a side of one of the sub-pixels. The connecting lines are electrically connected to the sub-units of the shift units, and one of the first data lines overlaps with one of the connecting lines in a direction perpendicular to a plane of the display panel. The compensation structures are located in the second display region, and each overlap with at least one of the second data lines in the direction perpendicular to the plane of the display panel.

BRIEF DESCRIPTION OF DRAWINGS

In order to explain technical schemes of the embodiments of the present disclosure more clearly, the drawings used in the embodiments will be briefly introduced below. The drawings in the following description merely illustrates some of the embodiments of the present disclosure, and other drawings can be obtained for those of ordinary skill in the art according to these drawings.

DESCRIPTION OF EMBODIMENTS

In order to better understand technical schemes of the present disclosure, embodiments of the present disclosure will be described in detail below with reference to the drawings.

It should be clear that described embodiments are only some of the embodiments of the present disclosure, but not all of them. On a basis of the embodiments in this disclosure, all other embodiments obtained by the ordinary skilled in the art also fall within a protection scope of this disclosure.

Terms used in the embodiments of the present disclosure are only for the purpose of describing specific embodiments, but not intended to limit the present disclosure. Singular forms of "a", "said", and "the" used in the embodiments of the present disclosure and the appended claims are also intended to include a plural form, unless the context clearly indicates other meaning otherwise.

It should be understood that the term "and/or" used in the present disclosure represents an association relationship to describe associated objects, and can indicate three relationships, for example, A and/or B can indicate A alone, A and B, and B alone. The character "/" in the present application generally indicates that associated object are in an "or" relationship.

A display panel is provided in an embodiment of the present disclosure, which can be a light-emitting diode (LED) display panel, such as a mini LED display panel or a micro LED display panel, or the display panel can also be an organic light-emitting diode (OLED) display panel.

Figure 1:
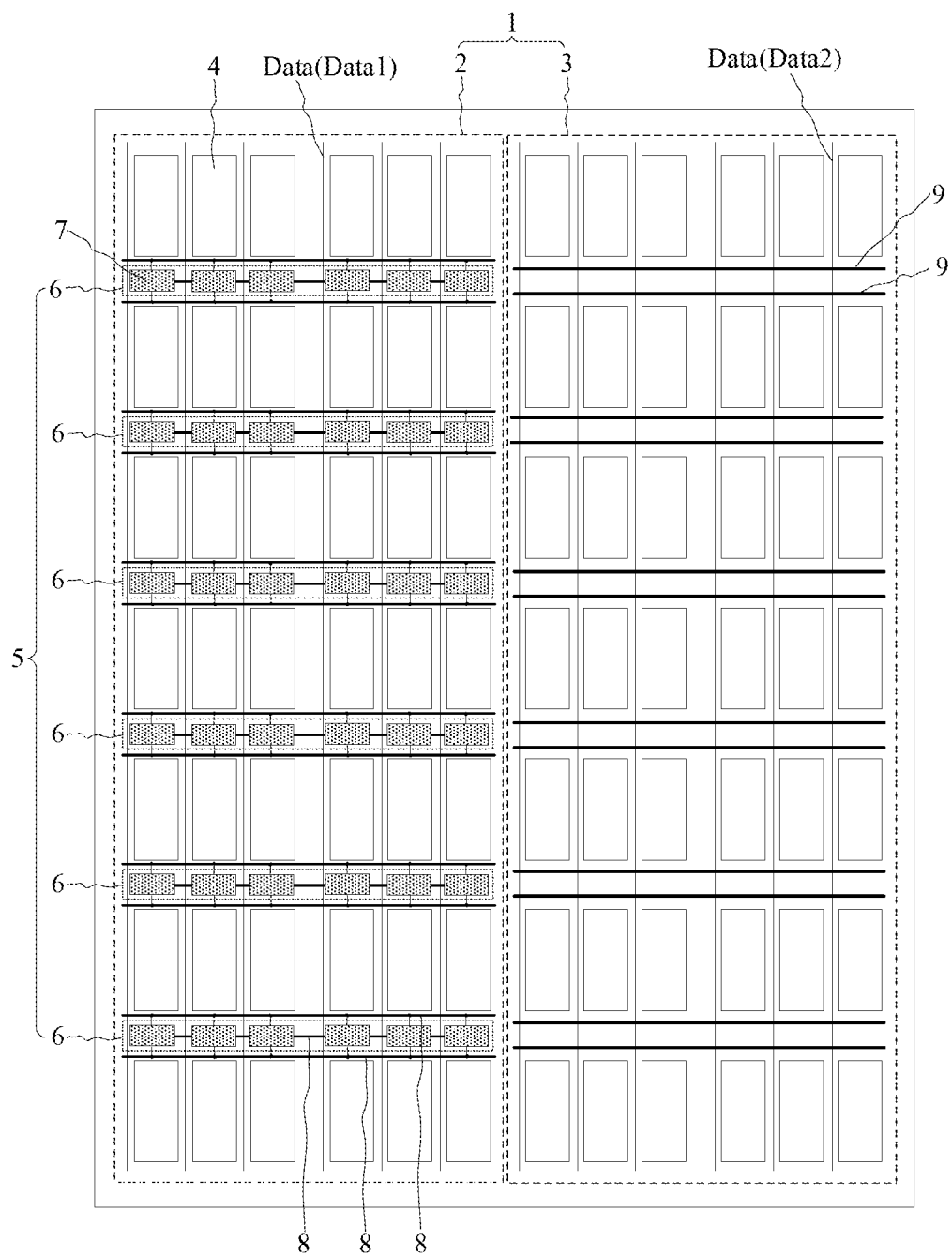
FIG. 1 is a schematic diagram of a display panel according to an embodiment of the present disclosure.

FIG. 1 is a schematic diagram of a display panel according to an embodiment of the present disclosure. As shown in FIG. 1, the display panel has a display region 1, and the display region 1 includes a first display region 2 and a second display region 3.

The display panel includes sub-pixels 4 located in the display region 1 and data lines Data. The data line Data is electrically connected to the sub-pixel 4 and configured to provide a data signal to the sub-pixel 4, and the data lines Data include a first data line Data1 located in the first display region 2 and a second data line Data2 located in the second display region 3.

The display panel also includes a shift register 5 located in the first display region 2 and electrically connected to the sub-pixels 4, and the shift register 5 is configured to provide scanning signals or light-emitting signals to the sub-pixels 4. The shift register 5 includes cascaded shift units 6. The shift unit 6 is divided into at least two sub-units 7, and one of the at least two sub-units 7 is located at a side of one of the sub-pixels 4. For example, the display panel includes multiple pixel rows, each pixel row includes multiple sub-pixels 4 arranged in a row direction, and the shift unit 6 can be located between two adjacent pixel rows, that is, the sub-unit 7 in the shift unit 6 is located at a side of the sub-pixels 4 in a column direction, and multiple sub-units 7 in a same shift unit 6 can be aligned with each other in the row direction.

In some embodiments, the display panel includes a connecting line 8 electrically connected to the sub-unit 7, and in a direction perpendicular to a plane of the display panel, the connecting line 8 overlaps with the first data line Data1 and does not overlap with the second data line Data2. The display panel also includes a compensation structure 9 located in the second display region 3 and overlapping with the second data line Data2 in the direction perpendicular to the plane of the display panel.

In some embodiments of the present disclosure, the shift register 5 is arranged in the display region 1, so the shift register 5 does not occupy a frame space, and can better realize ultra-narrow bezel design or borderless design of the display panel. Because there are a large number of transistors in a single shift unit 6, in the embodiment of the present disclosure, the shift unit 6 is divided into multiple sub-units 7 which are dispersedly arranged at a side of multiple sub-pixels 4, thereby optimizing arrangement of the shift register 5 in the display region 1.

It can be understood that when the shift unit 6 is divided into multiple sub-units 7 which are dispersedly arranged at a side of the multiple sub-pixels 4, the connecting line 8 between the sub-units 7 or the connecting line 8 between the sub-unit 7 and other signal line overlaps with the data line Data (the first data line Data1) around the sub-unit 7, thereby generating parasitic capacitance and increasing load of this first data line Data1. As a result, data signals transmitted on different data lines Data can have large difference in delay, resulting in charging difference between sub-pixels 4 electrically connected to different data lines Data, and thus causing vertical display non-uniformity of the display panel, that is, vertical Mura phenomenon.

In some embodiments of the present disclosure, by providing the compensation structure 9 overlapping with the second data line Data2 in the second display region 3, a parasitic capacitance formed by overlapping between the compensation structure 9 and the second data line Data2 can be configured to compensate parasitic capacitance formed by overlapping between the connecting line 8 and the first data line Data1, so that a load of the second data line Data2 and a load of the first data line Data1 tend to be consistent. In this way, delays of data signals transmitted on different data lines Data tend to be consistent, charging difference of sub-pixels 4 in the first display region 2 and the second display region 3 can be weakened, thus effectively improving vertical display non-uniformity of the display panel and optimizing the display performance of the display panel with ultra-narrow bezel or even borderless design.

Figure 2:
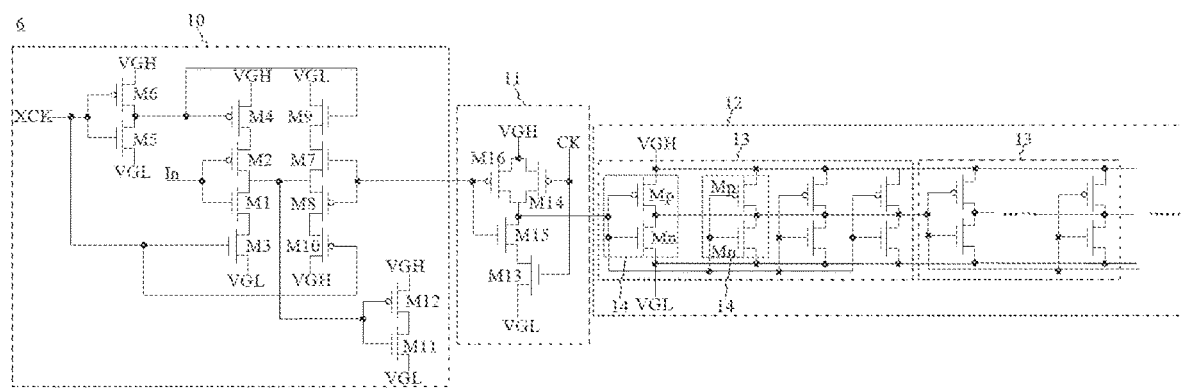
FIG. 2 is a circuit schematic diagram of a shift unit according to an embodiment of the present disclosure.
Figure 3:
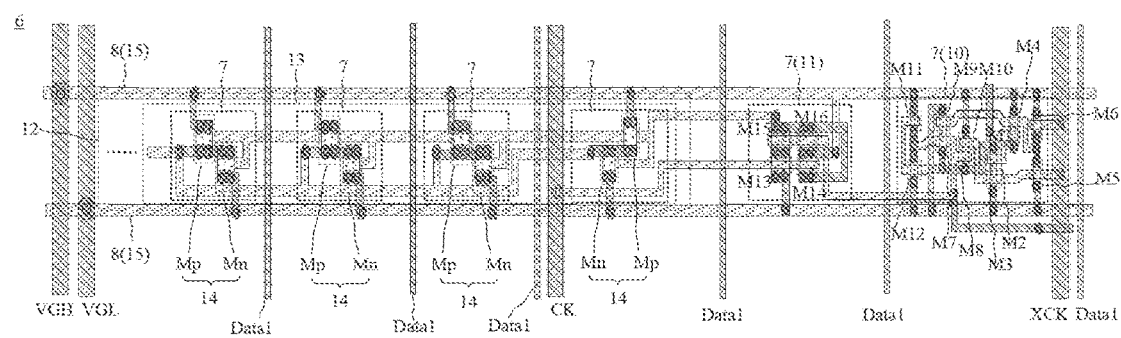
FIG. 3 is a layer schematic diagram of a display panel according to an embodiment of the present disclosure.
Figure 4:
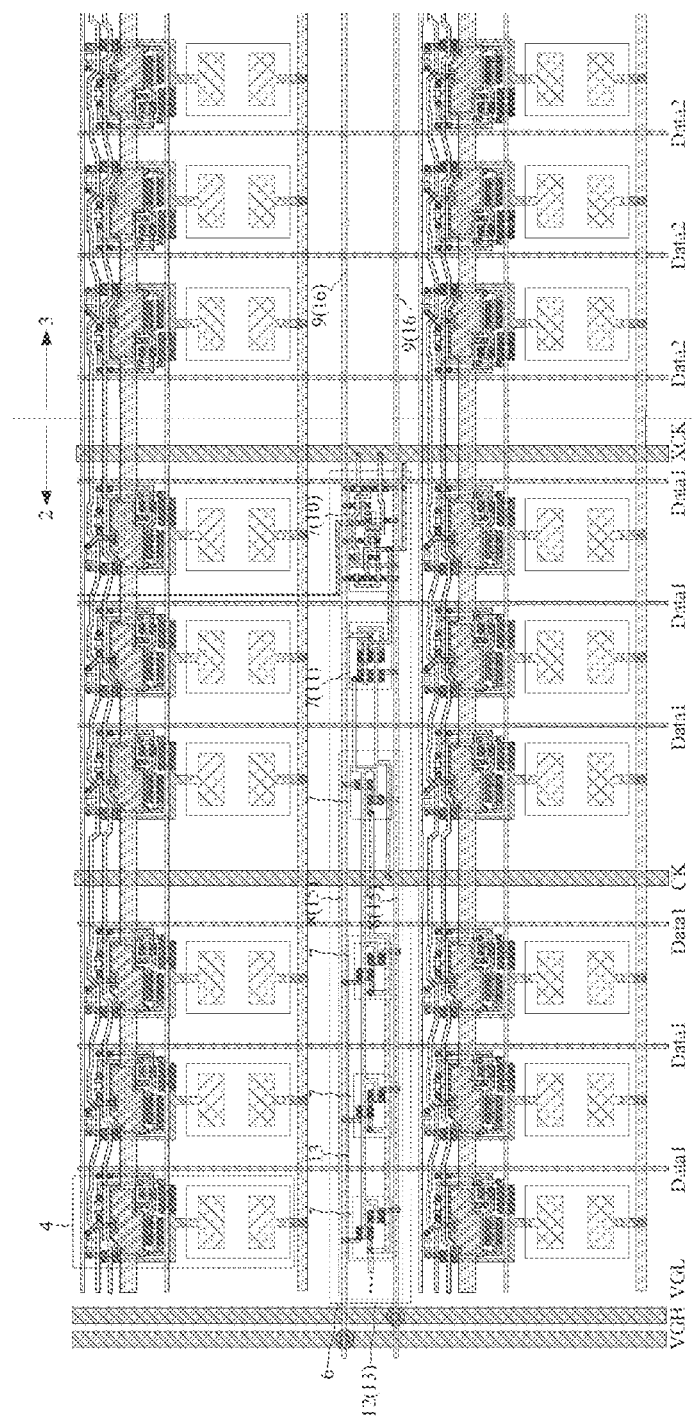
FIG. 4 is another layer schematic diagram of a display panel according to an embodiment of the present disclosure.

FIG. 2 is a circuit schematic diagram of a shift unit 6 according to an embodiment of the present disclosure; FIG. 3 is a layer schematic diagram of a display panel according to an embodiment of the present disclosure; and FIG. 4 is another layer schematic diagram of a display panel according to an embodiment of the present disclosure. The shift unit 6 includes a latch module 10, a logic module 11, and a buffer module 12. The logic module 11 is electrically connected between the latch module 10 and the buffer module 12, and the buffer module 12 is electrically connected between the logic module 11 and the sub-pixels 4. The buffer module 12 includes multiple buffer sub-modules 13 cascaded in sequence.

Exemplarily, the latch module 10 can include first through twelfth transistors M1 to M12, and the logic module 11 can include thirteenth through sixteenth transistors M13 to M16. The buffer sub-module 13 can include one or more complementary metal oxide semiconductor elements 14. For example, at least one buffer sub-module 13 includes multiple complementary metal oxide semiconductor elements 14 arranged in parallel, and the complementary metal oxide semiconductor element 14 includes a P-type transistor Mp and an N-type transistor Mn. A connection mode of the transistors described above is the same as that in the related art, which will not be repeated herein.

The latch module 10 provides a first signal to the logic module 11, and the logic module 11 performs an AND operation based on the first signal and a clock signal, outputs a second signal to the buffer module 12, and then the buffer module 12 performs voltage stabilization processing on the second signal.

In an embodiment of the present disclosure, the shift unit 6 is divided into sub-units 7 based on specific modules, for example, referring to FIG. 3 and FIG. 4, the latch module 10 can be one sub-unit 7, the logic module 11 can be another sub-unit 7, and each complementary metal oxide semiconductor element 14 in the buffer module 12 can be still another sub-unit 7.

In some embodiments, combined with FIG. 3 and FIG. 4, the connecting lines 8 include a first-type connecting line 15 configured to transmit a fixed voltage, and the first-type connecting line 15 overlaps with the first data line Data1 in the direction perpendicular to the plane of the display panel. It can be seen from the circuit structure shown in FIG. 2 that some of transistors in the latch module 10, the logic module 11, and the buffer module 12 receive a first fixed voltage $V_{GH}$ or a second fixed voltage $V_{GL}$, and the first-type connecting line 15 can refer to the connecting line 8 configured to transmit the first fixed voltage $V_{GH}$ or the second fixed voltage $V_{GL}$.

Referring to FIG. 4, the compensation structures 9 include a first-type compensation structure 16 configured to receive a fixed voltage, and the first-type compensation structure 16 overlaps with the second data line Data2 in the direction perpendicular to the plane of the display panel.

In the above structure, the first data line Data1 overlaps with the first-type connecting line 15 configured to transmit the fixed voltage. With the first-type compensation structure 16 which is also configured to transmit the fixed voltage and overlaps with the second data line Data2, parasitic capacitance generated by overlapping between the first-type compensation structure 16 and the second data line Data2 can approach parasitic capacitance generated by overlapping between the first-type connecting line 15 and the first data line Data1, thereby compensating the second data line Data2 more accurately.

Figure 5:
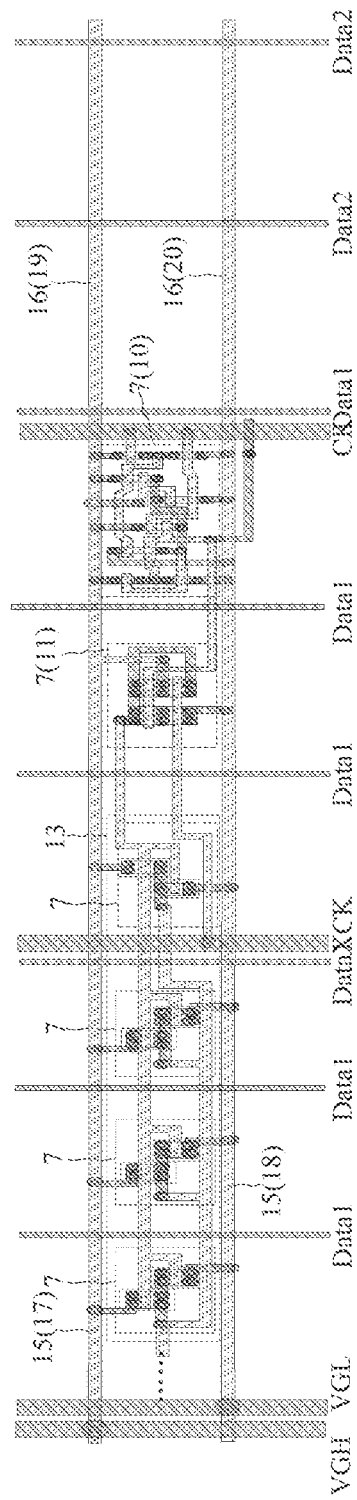
FIG. 5 is another layer schematic diagram of a display panel according to an embodiment of the present disclosure.

In some embodiments, as shown in FIG. 5, which is another schematic diagram of a display panel according to an embodiment of the present disclosure, the first-type connecting line 15 includes a first connecting line 17 configured to transmit a first fixed voltage $V_{GH}$ and a second connecting line 18 configured to transmit a second fixed voltage $V_{GL}$, and the first connecting line 17 and the second connecting line 18 each overlap with the first data line Data1 in the direction perpendicular to the plane of the display panel.

The first-type compensation structure 16 includes a first compensation line 19 configured to receive a first fixed voltage $V_{GH}$ and a second compensation line 20 configured to receive a second fixed voltage $V_{GL}$, and the first compensation line 19 and the second compensation line 20 each overlap with the second data line Data2 in the direction perpendicular to the plane of the display panel.

When the first-type connecting line 15 includes two kinds of connecting lines, i.e., the first connecting line 17 and the second connecting line 18, the first connecting line 17 continuously transmits a high voltage and the second connecting line 18 continuously transmits a low voltage. According to the embodiment of the present disclosure, with the first-type compensation structure 16 including the first compensation line 19 configured to transmit the high voltage and the second compensation line 20 configured to transmit the low voltage, the first compensation line 19 and the second compensation line 20 can be configured to simultaneously compensate the second data line Data2. In this case, parasitic capacitance generated between the first compensation line 19 and the second data line Data2 can accurately compensate parasitic capacitance generated between the first connecting line 17 and the first data line Data1, and parasitic capacitance generated between the second compensation line 20 and the second data line Data2 can accurately compensate parasitic capacitance generated between the second connecting line 18 and the first data line Data1.

In some embodiments, the display panel includes a first fixed potential signal line VGH and a second fixed potential signal line VGL. The first connecting line 17 is electrically connected to the first fixed potential signal line VGH to receive the first fixed voltage $V_{GH}$ provided by the first fixed potential signal line, and the second connecting line 18 is electrically connected to the second fixed potential signal line VGL to receive the second fixed voltage $V_{GL}$ provided by the second fixed potential signal line VGL. The first fixed potential signal line VGH and the second fixed potential signal line VGL can be located in the display region 1 and at a side close to an edge of the display region 1, or they can also be located at a middle of the display region 1.

Figure 6:
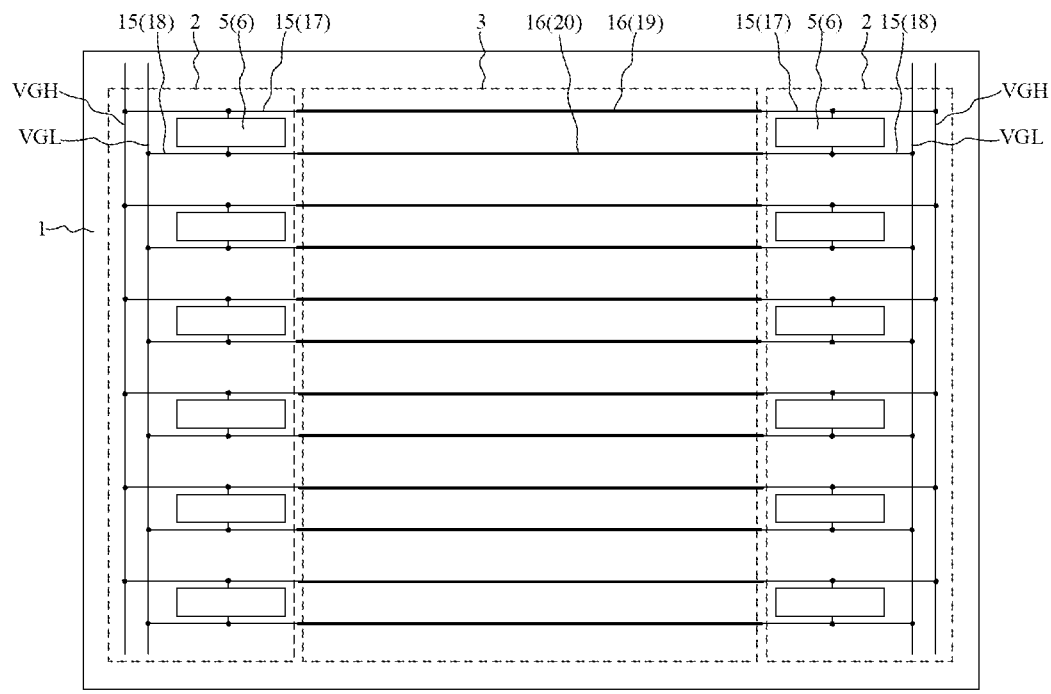
FIG. 6 is a position schematic diagram of a shift register according to an embodiment of the present disclosure.

In an embodiment of the present disclosure, when the shift register 5 is located in the display region 1, as shown in FIG. 6, which is a position schematic diagram of a shift register 5 according to an embodiment of the present disclosure, the shift register 5 can also be located at a side close to an edge of the display region 1. In some embodiments, as shown in FIG. 7, which is a position schematic diagram of a shift register 5 according to an embodiment of the present disclosure, the shift register 5 can also be located proximate to the middle of the display region 1, so as to reduce delay of scanning signals or light-emitting signals received by sub-pixels 4 at the middle and left and right sides of the display region 1.

Figure 7:
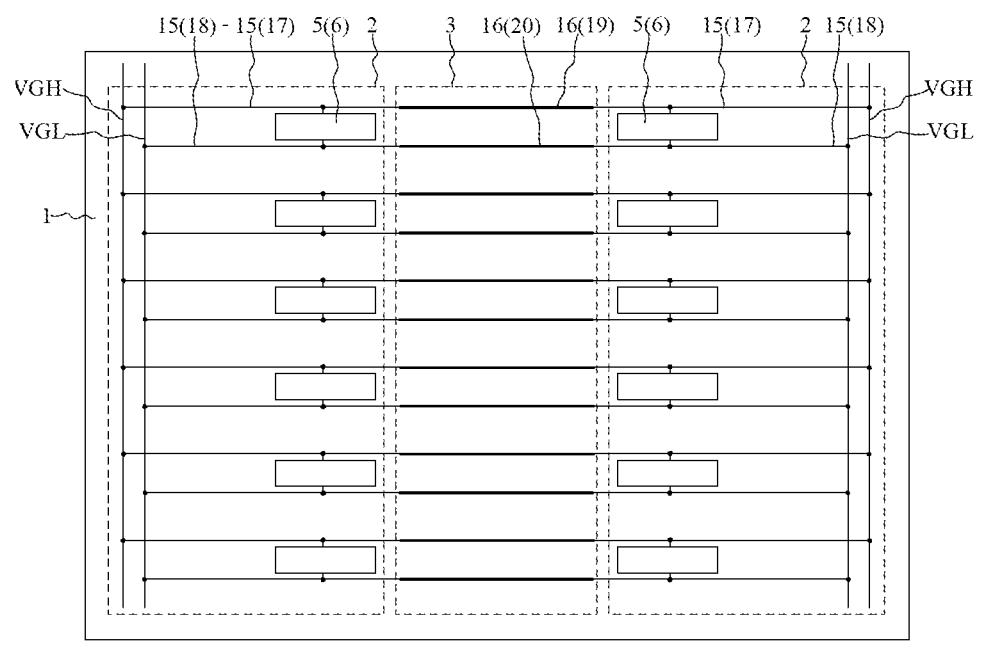
FIG. 7 is another position schematic diagram of a shift register according to an embodiment of the present disclosure.

In some embodiments, referring to FIG. 5 to FIG. 7, the first-type compensation structure 16 is in communication with the first-type connection line, that is, the first compensation line 19 and the first connecting line 17 are communicated with and connected to each other, and the second compensation line 20 and the second connecting line 18 are communicated with and connected to each other. In this case, the first connecting line 17 and the second connecting line 18 directly extend from the first display region 2 to the second display region 3, and these connecting lines extending to the second display region 3 can be reused as the first compensation line 19 and the second compensation line 20, respectively.

Figure 8:
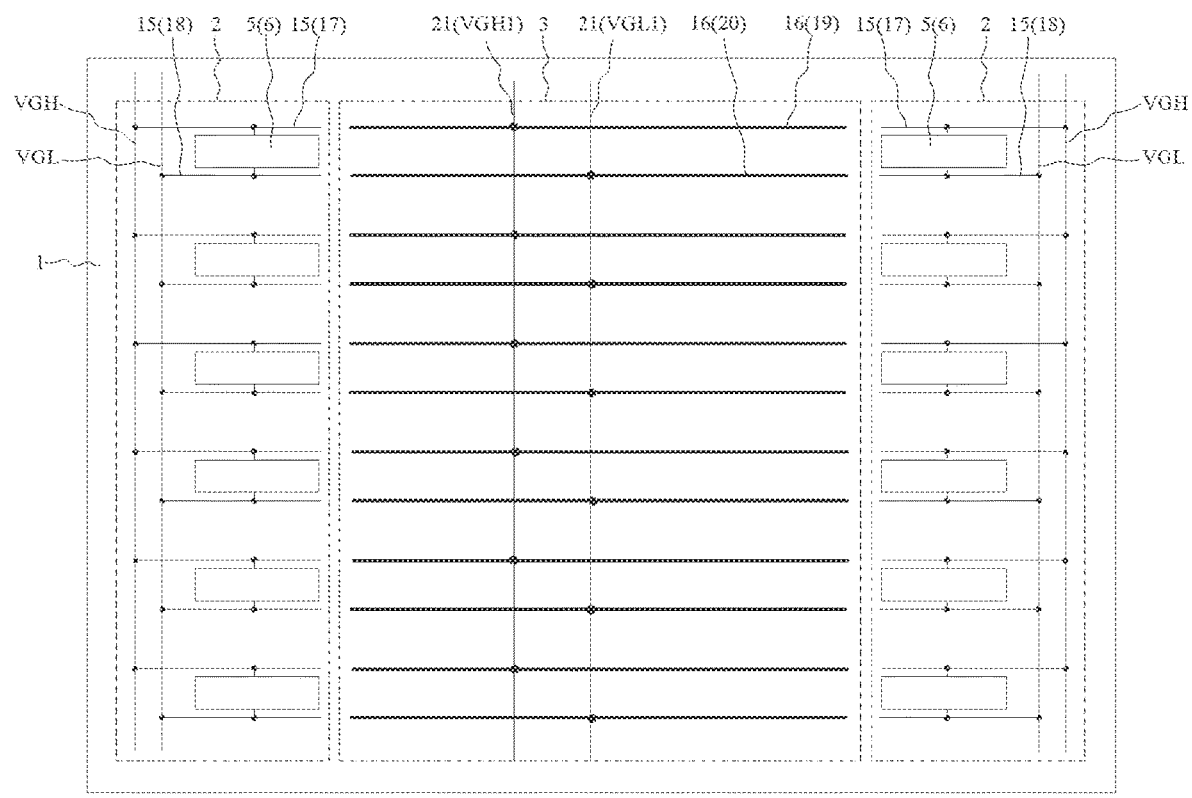
FIG. 8 is a schematic diagram of a constant voltage signal line according to an embodiment of the present disclosure.

In some embodiments, as shown in FIG. 8, which is a schematic diagram of a constant voltage signal line 21 according to an embodiment of the present disclosure, the display panel includes a constant voltage signal line 21 located in the second display region 3 and configured to provide a fixed voltage, and an extending direction of the constant voltage signal line 21 intersects with an extending direction of the first-type compensation structure 16, the first-type compensation structure 16 is electrically connected to the constant voltage signal line 21.

In some embodiments, the constant voltage signal line 21 can include a first constant voltage signal line VGH1 configured to transmit the first fixed voltage $V_{GH}$ and a second constant voltage signal line VGL1 configured to transmit the second fixed voltage $V_{GL}$. The first compensation line 19 is electrically connected to the first constant voltage signal line VGH1, and the second compensation line 20 is electrically connected to the second constant voltage signal line VGL1.

With such configuration, with the longitudinally extending constant voltage signal line 21 being provided in the second display region 3, the constant voltage signal line 21 can be configured to provide a constant voltage signal to the first-type compensation structure 16. In this case, no electrical connection is formed between the first-type connecting line 15 and the first-type compensation structure 16, which are independent from each other. The first-type compensation structure 16 does not affect a load of the first-type connecting line 15, thus avoiding attenuation and delay of the signals transmitted on the first-type connecting lines 15.

Figure 9:
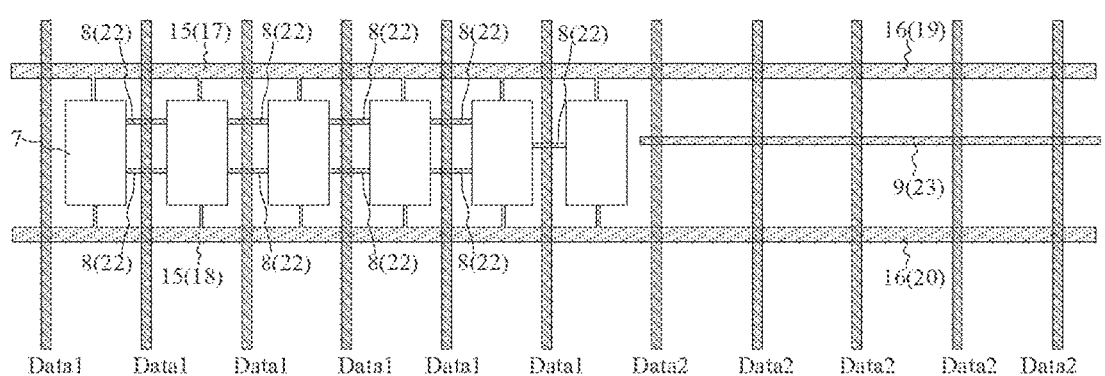
FIG. 9 is another schematic diagram of a compensation structure according to an embodiment of the present disclosure.
Figure 10:
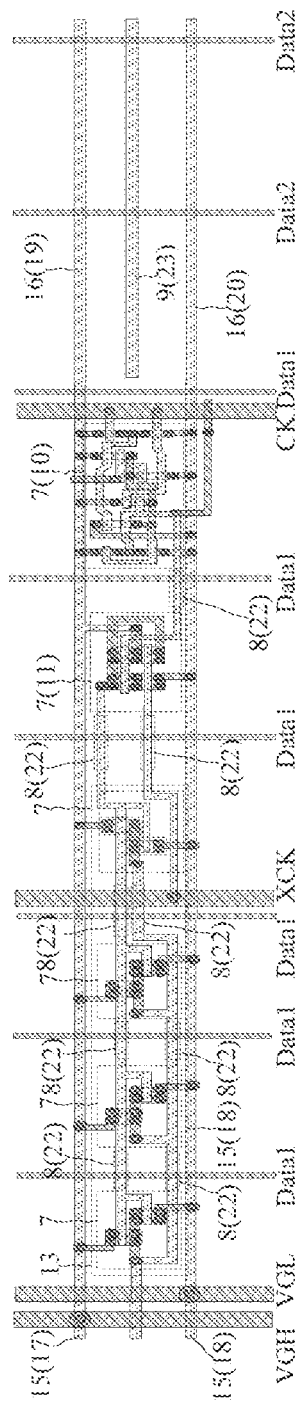
FIG. 10 is a layer schematic diagram of a display panel according to an embodiment of the present disclosure.

FIG. 9 is another schematic diagram of a compensation structure 9 according to an embodiment of the present disclosure, and FIG. 10 is another layer schematic diagram of a display panel according to an embodiment of the present disclosure. In some embodiments, as shown in FIG. 9 and FIG. 10, the connecting lines 8 include a second-type connecting line 22 electrically connected between sub-units 7, and the second-type connecting line 22 overlaps with at least one of the first data lines Data1 in the direction perpendicular to the plane of the display panel.

In some embodiments, the compensation structure 9 includes a second-type compensation structure 23, the second-type compensation structure 23 at least overlaps with the second data line Data2 in the direction perpendicular to the plane of the display panel.

As described above, the shift unit 6 includes the latch module 10, the logic module 11, and the buffer module 12. The latch module 10 and the logic module 11 are electrically connected to each other through the second-type connecting line 22, the logic module 11 and the buffer module 12 are electrically connected to each other through the second-type connecting line 22, and two adjacent complementary metal oxide semiconductor elements 14 in the buffer module 12 are electrically connected to each other through the second-type connecting line 22, and this second-type connecting line 22 can also overlap with the first data line Data1, thus generating parasitic capacitance.

According to the embodiment of the present disclosure, with the second-type compensation structure 23, parasitic capacitance generated between the second-type compensation structure 23 and the second data line Data2 can be configured to compensate parasitic capacitance generated between the second-type connecting line 22 and the first data line Data1, so that the compensated load of the second data line Data2 and the load of the first data line Data1 tend to be consistent, thus ensuring uniform delay of data signals transmitted on different data lines Data and improving charging uniformity of sub-pixels 4 at different positions.

Figure 11:
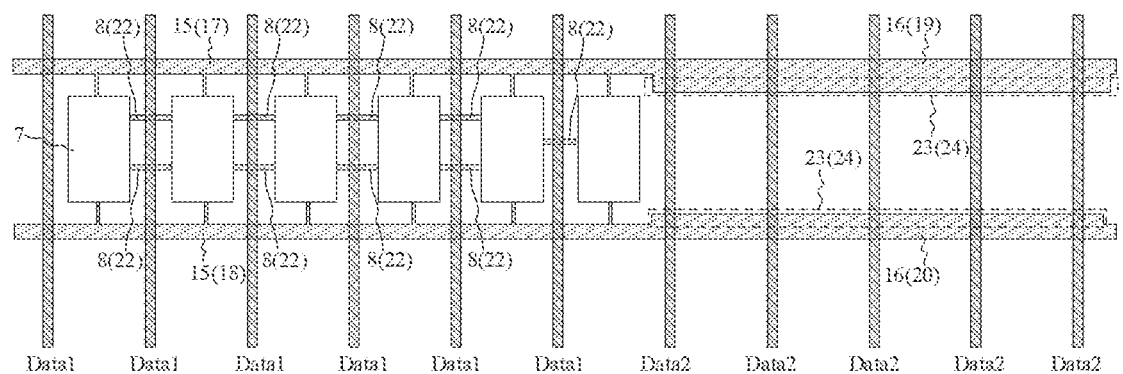
FIG. 11 is another schematic diagram of a second-type compensation structure according to the embodiment of the present disclosure.

FIG. 11 is another schematic diagram of a second-type compensation structure 23 according to the embodiment of the present disclosure. In some embodiments, as shown in FIG. 11, the connecting lines 8 include a first-type connecting line 15 configured to transmit a fixed voltage, and the first-type connecting line 15 overlaps with the first data line Data1 in the direction perpendicular to the plane of the display panel. The compensation structures 9 include a first-type compensation structure 16 configured to receive a fixed voltage, and the first-type compensation structure 16 overlaps with the second data line Data2 in the direction perpendicular to the plane of the display panel. The second-type compensation structure 23 is electrically connected to the first-type compensation structure 16.

In some embodiments, the first-type compensation structure 16 can include a first compensation line 19 configured to transmit a first fixed voltage $V_{GH}$ and a second compensation line 20 configured to transmit a second fixed voltage $V_{GL}$. The second-type compensation structure 23 can be electrically connected to at least one of the first compensation line 19 or the second compensation line 20.

According to a circuit structure of the shift unit 6 shown in FIG. 3, when the shift unit 6 is in operation, the second-type connecting line 22 electrically connected between the latch module 10 and the logic module 11, the second-type connecting line 22 electrically connected between the logic module 11 and the buffer module 12, and the second-type connecting line 22 electrically connected between two adjacent complementary metal oxide semiconductor elements 14 in the buffer module 12 are configured to transmit the first fixed voltage $V_{GH}$ or the second fixed voltage $V_{GL}$. Therefore, by electrically connecting the second-type compensation structure 23 with the first-type compensation structure 16, the second-type compensation structure 23 is also configured to transmit the first fixed voltage $V_{GH}$ or the second fixed voltage $V_{GL}$, thus realizing more accurate compensation for the second data line Data2.

In some embodiments, referring to FIG. 11, the second-type compensation structure 23 includes a protruding compensation part 24, and the protruding compensation part 24 at least overlaps with the second data line Data2 in the direction perpendicular to the plane of the display panel. The protruding compensation part 24 is in communication with the first-type compensation structure 16, and protrudes from the first-type compensation structure 16 in a direction parallel to the plane of the display panel. In this case, the second-type compensation structure 23 directly protrudes from the first-type compensation structure 16 to be electrically connected to the first-type compensation structure 16, and thus a high reliability of the connection between the second-type compensation structure 23 and the first-type compensation structure 16 is reached, and a connecting line therebetween is not necessary.

Figure 12:
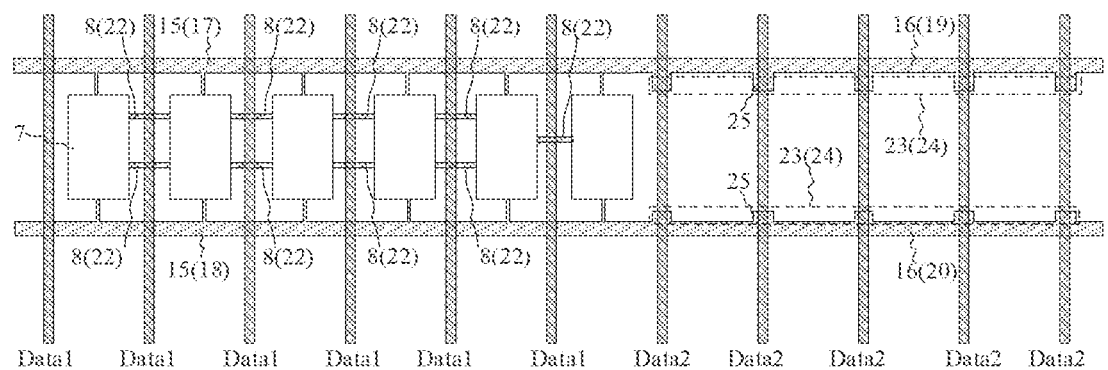
FIG. 12 is another schematic diagram of a second-type compensation structure according to the embodiment of the present disclosure.

In some embodiments, as shown in FIG. 12, which is another schematic diagram of a second-type compensation structure 23 according to an embodiment of the present disclosure, the protruding compensation part 24 includes multiple compensation sub-parts 25, the multiple compensation sub-parts 25 are arranged at intervals along an extending direction of the first-type compensation structure 16, and the compensation sub-parts 25 overlap with the second data line Data2 in the direction perpendicular to the plane of the display panel.

By providing multiple compensation sub-parts 25 which are arranged at intervals and each have a small area, it is possible to reduce shielding of the protruding compensation parts 24 to regions other than the second data line Data2. While using the protruding compensation parts 24 to compensate a load of the second data line Data2, it is also possible to avoid parasitic capacitance caused by overlapping between the protruding compensation parts 24 and other signal lines, thus avoiding effecting signals transmitted on other signal lines.

Combined with a circuit structure of the shift unit 6 shown in FIG. 3, multiple modules in the shift unit 6 each are electrically connected to the first fixed potential signal line VGH and the second fixed potential signal line VGL. Therefore, the first-type connecting lines 15 has a large extending length and cross multiple first data lines Data1 to realize electrical connection to the sub-unit 7 and to the first fixed potential signal line VGH and the second fixed potential signal line VGL. In this case, the first-type connecting lines 15 can overlap with other types of signal lines besides the first data line Data. Therefore, in some embodiments of the present disclosure, by designing the first-type compensation structure 16 as lines, a structure of the first-type compensation structure 16 can be more similar to a structure of the first-type connecting line 15, and the first-type compensation structure 16 overlaps with other types of signal lines as well as the second data line Data2, thus effectively compensating loads of other signal lines.

For the second-type connecting line 22, the second-type connecting line 22 is only connected between two sub-units 7, that is, one second-type connecting line 22 only overlaps with one first data line Data1. In this case, by designing the protruding compensation part 24 to be multiple compensation sub-parts 25 which are arranged at intervals and each have a small area, the protruding compensation part 24 can overlap with only the second data line Data2, but not with other signal lines, so that the structure of the protruding compensation part 24 is more similar to the structure of the second-type connecting lines 22.

Therefore, according to the embodiment of the present disclosure, the first-type compensation structure 16 and the second-type compensation structure 23 are designed differently to achieve a better compensation effect.

Figure 13:
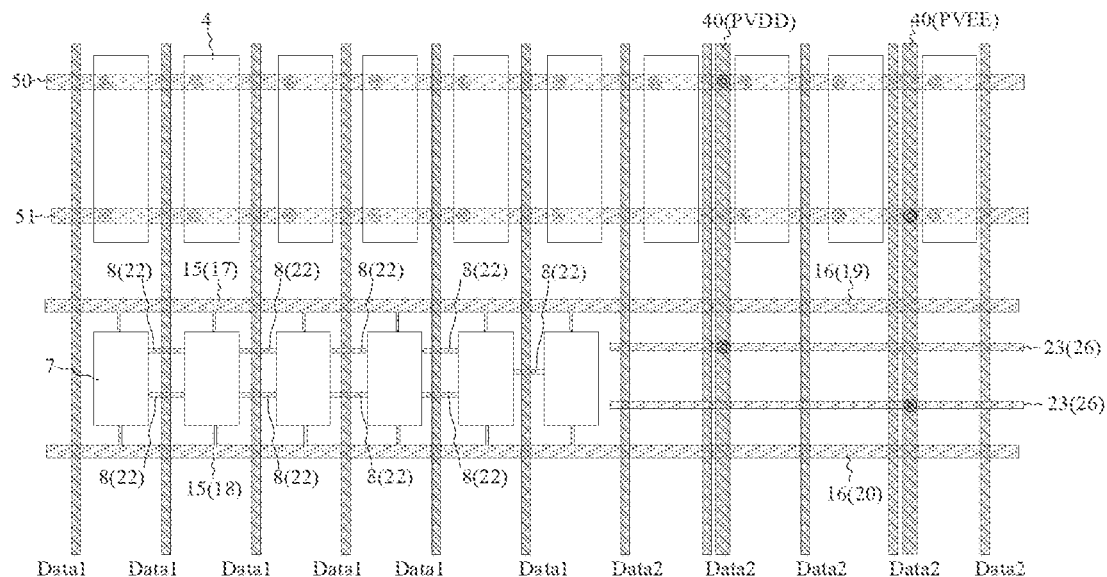
FIG. 13 is another schematic diagram of a second-type compensation structure according to the embodiment of the present disclosure.

In some embodiments, as shown in FIG. 13, which is another structural schematic diagram of a second-type compensation structure 23 according to the embodiment of the present disclosure, the second-type compensation structure 23 includes a third compensation line 26, and the third compensation line 26 extends in a same direction as the first-type compensation structure 16 and is spaced apart from the first-type compensation structure 16. In this structure, a single third compensation line 26 can be configured to overlap with the second data line Data2 to compensate the load of the second data line Data2.

In some embodiments, referring to FIG. 13 again, the display panel includes a power signal line 40 located in the display region 1, and the power signal line 40 is electrically connected to the sub-pixel 4 and configured to a power signal to the sub-pixel 4. In this case, the second-type compensation structure 23 can also be electrically connected to the power signal line 40, for example, the third compensation line 26 is electrically connected to the power signal line 40, so as to provide a voltage signal for the third compensation line 26 by using an original signal line in the display region 1.

Exemplarily, the power supply signal line can include a positive power supply signal line PVDD configured to transmit a positive power supply signal and a negative power supply signal line PVEE configured to transmit a negative power supply signal. The positive power supply signal line PVDD is electrically connected to multiple sub-pixels 4 in a pixel row through a laterally extending first power supply connecting line 50, and the negative power supply signal line PVEE is electrically connected to multiple sub-pixels 4 in a pixel row through a laterally extending second power supply connecting line 52. The second-type compensation structure 23 can include two third compensation lines 26, one of which is electrically connected to the positive power signal line PVDD, and the other one of which is electrically connected to the negative power signal line PVEE.

Figure 14:
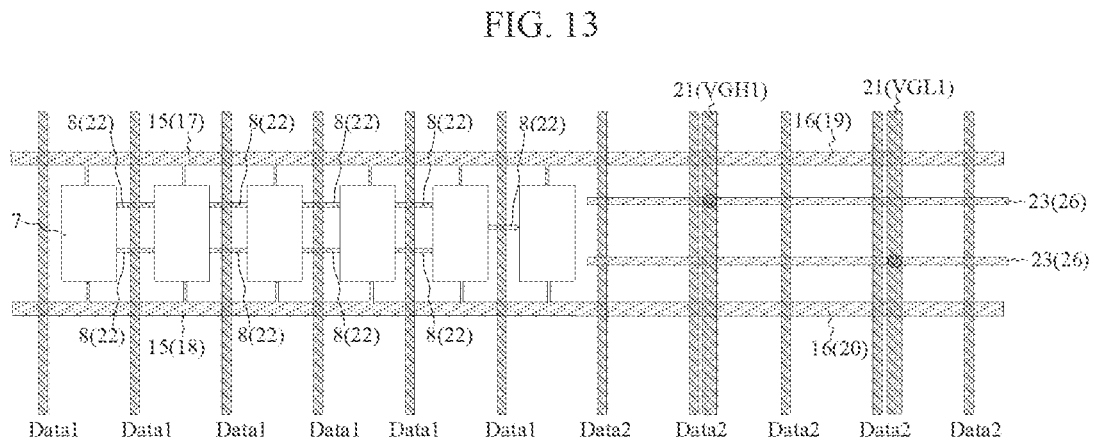
FIG. 14 is another schematic diagram of a second-type compensation structure according to the embodiment of the present disclosure.

In some embodiments, as shown in FIG. 14, which is still another structural schematic diagram of a second-type compensation structure 23 according to the embodiment of the present disclosure, a constant voltage signal line 21 configured to provide a fixed voltage can also be provided in the second display region 3. For example, the constant voltage signal line 21 can specifically include a first constant voltage signal line VGH1 configured to transmit the first fixed voltage $V_{GH}$ and a second constant voltage signal line VGL1 configured to transmit the second fixed voltage $V_{GL}$. In this case, the second-type compensation structure 23 can be electrically connected to the first constant voltage signal line VGH1 and/or the second constant voltage signal line VGL1, and configured to receive a voltage transmitted thereto by the constant voltage signal line 21.

Figure 15:
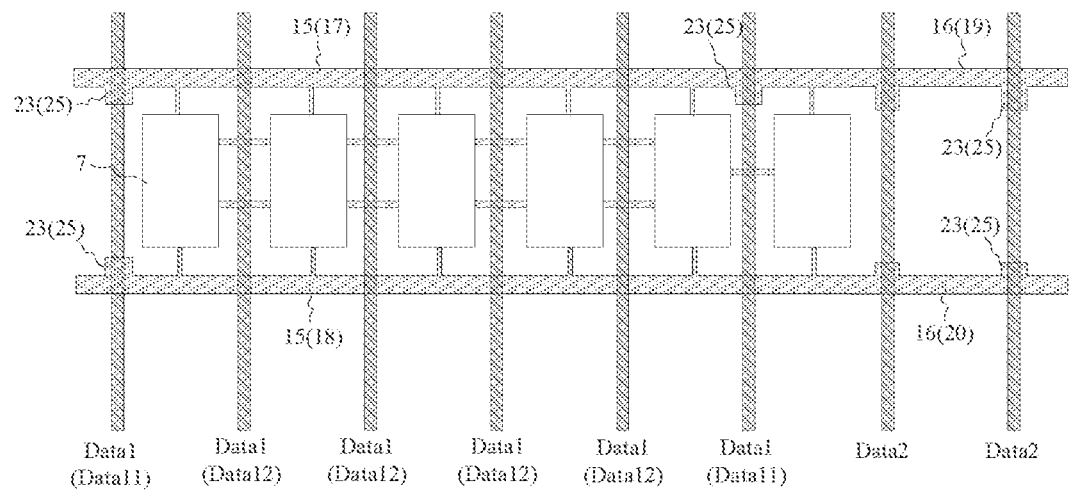
FIG. 15 is another schematic diagram of a second-type compensation structure according to the embodiment of the present disclosure.

In some embodiments, as shown in FIG. 15, which is another schematic diagram of a second-type compensation structure 23 according to the embodiment of the present disclosure, the first data lines Data1 include a first A data line Data11 and a first B data line Data12, and a number of the second-type connecting lines 22 overlapping with the first A data line Data11 is smaller than a number of the second-type connecting lines 22 overlapping with the first B data line Data12 in the direction perpendicular to the plane of the display panel. In the direction perpendicular to the plane of the display panel, the second-type compensation structure 23 also overlaps with the first A data line Data11.

Because the number of the second-type connecting lines 22 overlapping with the first A data line Data11 is different from the number of the second-type connecting lines 22 overlapping with the first B data line Data12, parasitic capacitance generated between the second-type connecting lines 22 and the first A data line Data11 is different from parasitic capacitance generated between the second-type connecting lines 22 and the first B data line Data12, and correspondingly, delays of the data signals transmitted on the first A data line Data11 and the first B data line Data12 are also different. According to the embodiment of the disclosure, the second-type compensation structure 23 overlaps with the first A data line Data11, the second-type compensation structure 23 can be used to increase the load of the first A data line Data11, thereby reducing load difference between the first A data line Data11 and the first B data line Data12, and improving delay uniformity of data signals transmitted on the first A data line Data11 and the first B data line Data12.

Figure 16:
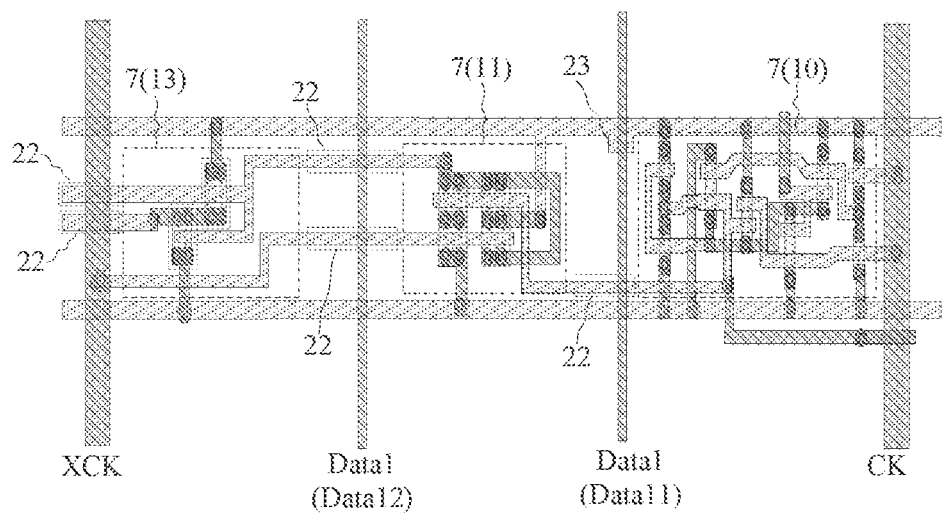
FIG. 16 is a position schematic diagram of a first A data line according to an embodiment of the present disclosure.

In some embodiments, as shown in FIG. 16, which is a position schematic diagram of a first A data line Data11 according to an embodiment of the present disclosure, the shift unit 6 includes a latch module 10, a logic module 11, and a buffer module 12, and the logic module 11 is electrically connected between the latch module 10 and the buffer module 12. The latch module 10 and the logic module 11 are divided into different sub-units 7, and at least one first A data line Data11 is located between the latch module 10 and the logic module 11.

In layout design of the shift unit 6, the logic module 11 and the buffer module 12 are electrically connected by two second-type connecting lines 22, while the latch module 10 and the logic module 11 are electrically connected by only one connecting line 8. As for the first A data line Data11 between the latch module 10 and the logic module 11, the second-type connecting lines 22 also overlaps with this first A data line Data11 through the second-type compensation structure 23 due to a small number of the second-type connecting lines 22 overlapping with the first A data line, which can better compensate load difference between this first data line A Data11 and the first B data line Data12.

Figure 17:
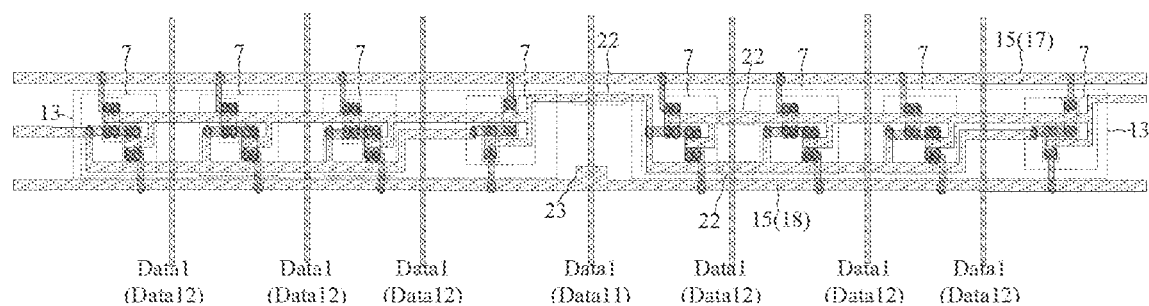
FIG. 17 is another position schematic diagram of a first A data line according to an embodiment of the present disclosure.

FIG. 17 is a position schematic diagram of a first A data line Data11 according to an embodiment of the present disclosure. In some embodiments, such as shown in FIG. 17, the shift unit 6 includes a latch module 10, a logic module 11, and a buffer module 12, the logic module 11 is electrically connected between the latch module 10 and the buffer module 12, and the buffer module 12 includes multiple buffer sub-modules 13 electrically connected in sequence. Different buffer sub-modules 13 are divided into different sub-units 7, and at least one first A data line A Data11 is located between two adjacent buffer sub-modules 13.

In the layout design of the shift unit 6, when the buffer sub-module 13 includes at least two parallel complementary metal oxide semiconductor elements 14, and multiple sub-units 7 in the buffer sub-modules 13 are located are electrically connected to each other by two second-type connecting lines 22, while different the buffer sub-modules 13 are electrically connected by only one connecting line 8. As for the first A data line Data11 between two adjacent buffer sub-modules 13, the second-type connecting lines 22 overlaps with this first A data line Data11 through the second-type compensation structure 23 due to a small number of the second-type connecting lines 22 overlapping with this first A data line, which can better compensate load difference between this first A data line Data11 and the first B data line Data12.

Figure 18:
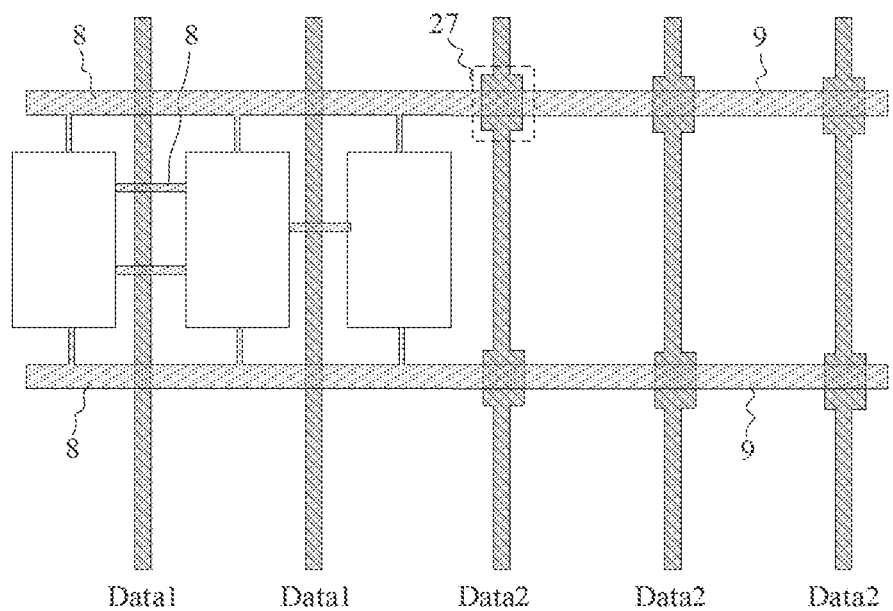
FIG. 18 is a schematic diagram of a second data line according to an embodiment of the present disclosure.

In some embodiments, as shown in FIG. 18, which is a schematic diagram of a second data line Data2 according to an embodiment of the present disclosure, the second data line Data2 includes a first line segment 27, and the first line segment 27 overlaps with the compensation structure 9 in the direction perpendicular to the plane of the display panel. In the direction perpendicular to the extending direction of the data line Data, a width of the first line segment 27 is greater than a width of the first data line Data1.

In this structure, an overlapping area between the second data line Data2 and the compensation structure 9 can be increased by increasing a width of a line segment where the second data line Data2 overlaps with the compensation structure 9, so as to increase parasitic capacitance generated between the second data line Data2 and the compensation structure 9, and thus to compensate the load of the second data line Data2.

Although increasing a width of the first line segment 27 can reduce resistance of the first line segment 27, reduction of the resistance is far less than increase of the parasitic capacitance, so as a whole, an overall load of the second data line Data2 is increased.

Figure 19:
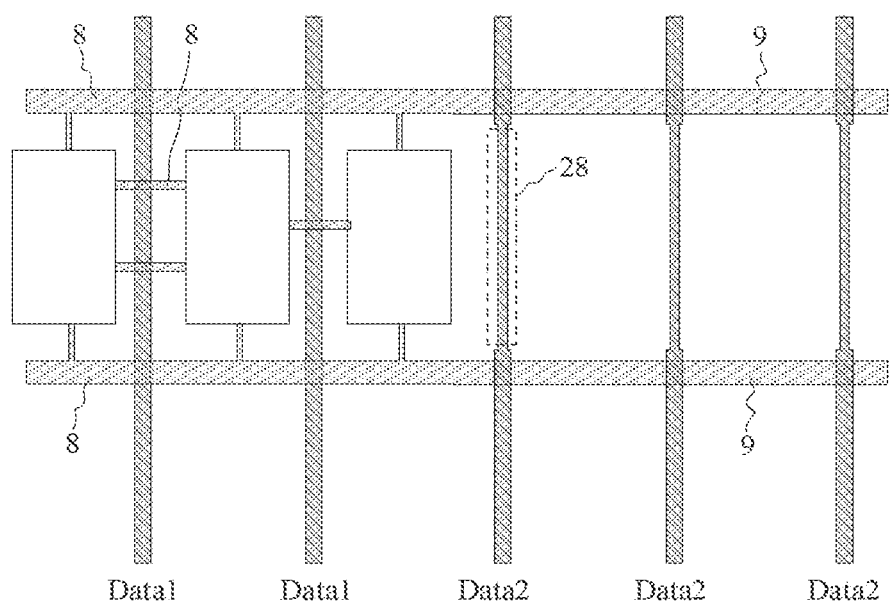
FIG. 19 is another schematic diagram of a second data line according to an embodiment of the present disclosure.

In some embodiments, as shown in FIG. 19, which is another schematic diagram of a second data line Data2 according to an embodiment of the present disclosure, the second data line Data2 includes a second line segment 28, and the second line segment 28 does not overlap with the compensation structure 9 in the direction perpendicular to the plane of the display panel. In a direction perpendicular to an extending direction of the data line Data, a width of the second line segment 28 is smaller than a width of the first data line Data1.

In this structure, the impedance of the second data line Data2 can be increased by reducing a width of a part of the second data line Data2 that does not overlap with the compensation structure 9, thereby increasing the load of the second data line Data2 and reducing the load difference between the second data line Data2 and the first data line Data1.

Figure 20:
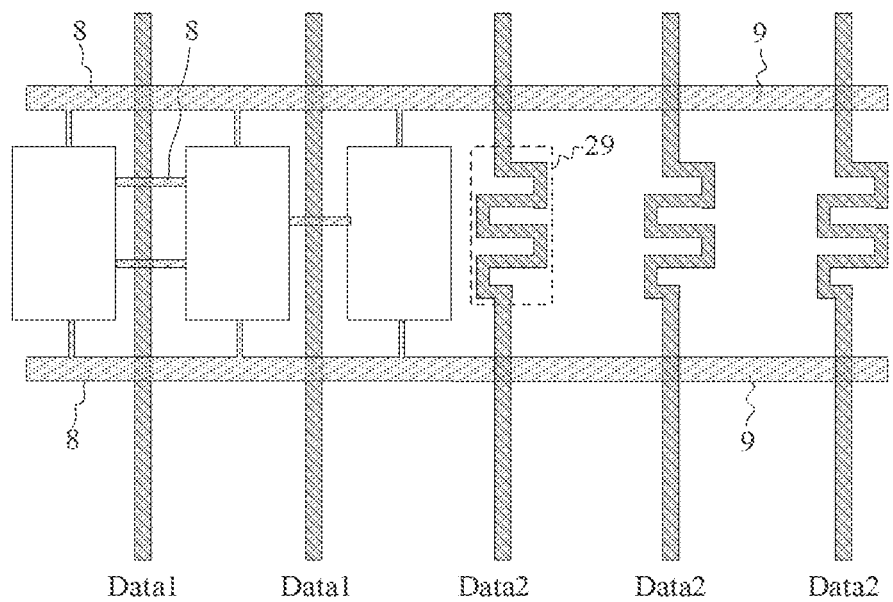
FIG. 20 is another schematic diagram of a second data line according to an embodiment of the present disclosure.

In some embodiments, as shown in FIG. 20, which is another schematic diagram of a second data line Data2 according to an embodiment of the present disclosure, the second data line Data2 includes a third line segment 29, and the third line segment 29 does not overlap with the compensation structure 9 in the direction perpendicular to the plane of the display panel, and the third line segment 29 extends non-linearly. The third line segment 29 can be a zigzag line or a wavy line.

Compared with the first data line Data1, by extending the third line segment 29 of the second data line Data2 in a broken line, a length of the second data line Data2 can be increased, and then impedance of the second data line Data2 can be increased so as to reduce load difference between the second data line Data2 and the first data line Data1 to a greater extent.

Figure 21:
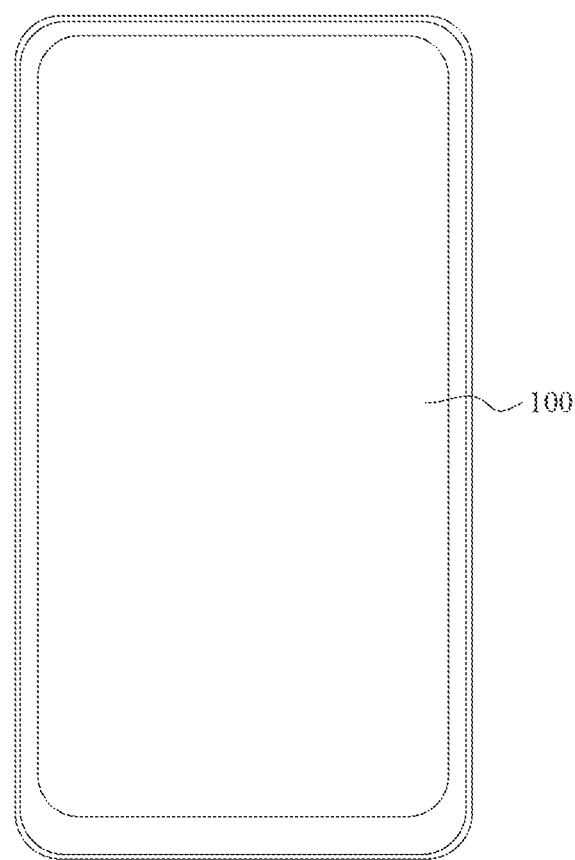
FIG. 21 is a schematic diagram of a display apparatus according to an embodiment of the present disclosure.

Based on a same concept, a display apparatus is provided in an embodiment of the present disclosure, as shown in FIG. 21, which is a schematic diagram of a display apparatus according to an embodiment of the present disclosure, and the display apparatus includes the above display panel 100. A structure of the display panel 100 has been described in detail in the above embodiments, which will not be repeated herein. The display apparatus shown in FIG. 21 is only a schematic illustration, and the display apparatus can be, for example, an LED spliced screen, a cinema screen, an electronic product viewing in distance, or the like.

The above are only some embodiments of the present disclosure, but not intended to limit the present disclosure. Any modifications, equivalents, improvements, etc. made within the principle of the present disclosure should fall within the scope of the present disclosure.

Finally, it should be noted that the above embodiments are only intended to illustrate technical schemes of the present disclosure, but not to limit it. Although the present disclosure has been described in detail with reference to the foregoing embodiments, it should be understood by ordinary skilled in the art that modifications can be made to the technical schemes described in the foregoing embodiments, or equivalent substitutions can be made to some or all of technical features thereof. These modifications or substitutions do not cause essence of corresponding technical schemes to depart from the scope of the technical schemes of the embodiments of this disclosure.

What is claimed is:

1. A display panel, having a display region including a first display region and a second display region, wherein the display panel comprises:
    sub-pixels located in the display region;
    data lines electrically connected to the sub-pixels and comprising first data lines located in the first display region and second data lines located in the second display region;
    a shift register located in the first display region and comprising shift units that are cascaded, wherein each of the shift units is divided into at least two sub-units, and wherein one of the at least two sub-units is located at a side of one of the sub-pixels;
    connecting lines electrically connected to the sub-units of the shift units, wherein one of the first data lines overlaps with one of the connecting lines in a direction perpendicular to a plane of the display panel; and
    compensation structures located in the second display region and each overlapping with at least one of the second data lines in the direction perpendicular to the plane of the display panel, and
    wherein the connecting lines comprise a first-type connecting line configured to transmit a fixed voltage, wherein the first-type connecting line overlaps with one of the first data lines in the direction perpendicular to the plane of the display panel; and
    the compensation structures comprise a first-type compensation structure configured to receive the fixed voltage, wherein the first-type compensation structure overlaps with at least one of the second data lines in the direction perpendicular to the plane of the display panel.

2. The display panel according to claim 1, wherein the first-type connecting line comprises a first connecting line configured to transmit a first fixed voltage and a second connecting line configured to transmit a second fixed voltage, wherein both the first connecting line and the second connecting line overlap with one of the first data lines in the direction perpendicular to the plane of the display panel; and the first-type compensation structure comprises a first compensation line configured to receive the first fixed voltage and a second compensation line configured to receive the second fixed voltage, wherein both the first compensation line and the second compensation line overlap with one of the second data lines in the direction perpendicular to the plane of the display panel.

3. The display panel according to claim 1, wherein the first-type compensation structure is in communication with the first-type connecting line.

4. The display panel according to claim 1, further comprising:

a constant voltage signal line arranged in the second display region and configured to provide the fixed voltage, wherein an extending direction of the constant voltage signal line intersects with an extending direction of the first-type compensation structure, and the first-type compensation structure is electrically connected to the constant voltage signal line.

5. A display apparatus, comprising the display panel according to claim 1.

6. A display panel, having a display region including a first display region and a second display region, wherein the display panel comprises:

sub-pixels located in the display region;

data lines electrically connected to the sub-pixels and comprising first data lines located in the first display region and second data lines located in the second display region;

a shift register located in the first display region and comprising shift units that are cascaded, wherein each of the shift units is divided into at least two sub-units, and wherein one of the at least two sub-units is located at a side of one of the sub-pixels;

connecting lines electrically connected to the sub-units of the shift units, wherein one of the first data lines overlaps with one of the connecting lines in a direction perpendicular to a plane of the display panel; and compensation structures located in the second display region and each overlapping with at least one of the second data lines in the direction perpendicular to the plane of the display panel, wherein the connecting lines comprise at least one second-type connecting line electrically connected between the sub-units, wherein one of the at least one second-type connecting line overlaps with at least one of the first data lines in the direction perpendicular to the plane of the display panel;

the compensation structures comprise a second-type compensation structure, wherein the second-type compensation structure at least overlaps with one of the second data lines in the direction perpendicular to the plane of the display panel;

the connecting lines comprise a first-type connecting line configured to transmit a fixed voltage, wherein the first-type connecting line overlaps with one of the first data lines in the direction perpendicular to the plane of the display panel;

the compensation structures comprise a first-type compensation structure configured to receive the fixed voltage, wherein the first-type compensation structure overlaps with one of the second data lines in the direction perpendicular to the plane of the display panel; and the second-type compensation structure is electrically connected to the first-type compensation structure.

7. The display panel according to claim 6, wherein the second-type compensation structure comprises a protruding compensation part, wherein the protruding compensation part at least overlaps with one of the second data lines in the direction perpendicular to the plane of the display panel; and the protruding compensation part is in communication with the first-type compensation structure, and the protruding compensation part protrudes from the first-type compensation structure in the direction parallel to the plane of the display panel.

8. The display panel according to claim 7, wherein the protruding compensation part comprises compensation sub-parts, wherein the compensation sub-parts are arranged along an extending direction of the first-type compensation structure, and wherein one of the compensation sub-parts overlaps with one of the second data lines in the direction perpendicular to the plane of the display panel.

9. The display panel according to claim 6, wherein the second-type compensation structure comprises a third compensation line, the third compensation line extending in a same direction as the first-type compensation structure and being spaced apart from the first-type compensation structure.

10. The display panel according to claim 7, further comprising:

at least one power signal line located in the display region and electrically connected to at least one of the sub-pixels, wherein the second-type compensation structure is electrically connected to one of the at least one power signal line.

11. The display panel according to claim 7, wherein the first data lines comprise at least one first A data line and at least one first B data line, and in the direction perpendicular to the plane of the display panel, wherein a number of the second-type connecting lines overlap with one of the at least one first A data line is smaller than a number of the second-type connecting line overlapping with one of the at least one first B data line; and wherein the second-type compensation structure further overlaps with one of the at least one first A data line, in the direction perpendicular to the plane of the display panel.

12. The display panel according to claim 11, wherein each of the shift units comprises a latch module, a logic module, and a buffer module, wherein the logic module is electrically connected between the latch module and the buffer module; and the latch module and the logic module are divided into different sub-units of the at least two sub-units, and one of the at least one first A data line is located between the latch module and the logic module.

13. The display panel according to claim 11, wherein each of the shift units comprises a latch module, a logic module, and a buffer module, wherein the logic module is electrically connected between the latch module and the buffer module; and the buffer module comprises buffer sub-modules electrically connected in sequence; and each one of the buffer sub-modules are located in different sub-units of the sub-units, and one of the at least one first A data line is located between two adjacent buffer sub-modules of the buffer sub-modules.

14. A display panel, having a display region including a first display region and a second display region, wherein the display panel comprises:

sub-pixels located in the display region;

data lines electrically connected to the sub-pixels and comprising first data lines located in the first display region and second data lines located in the second display region;

a shift register located in the first display region and comprising shift units that are cascaded, wherein each of the shift units is divided into at least two sub-units, and wherein one of the at least two sub-units is located at a side of one of the sub-pixels;

connecting lines electrically connected to the sub-units of the shift units, wherein one of the first data lines overlaps with one of the connecting lines in a direction perpendicular to a plane of the display panel; and compensation structures located in the second display region and each overlapping with at least one of the second data lines in the direction perpendicular to the plane of the display panel, wherein one of the second data lines comprises a first line segment, the first line segment overlapping with one of the compensation structures in the direction perpendicular to the plane of the display panel, and a width of the first line segment is greater than a width of one of the first data lines, in a direction perpendicular to an extending direction of one of the data lines; or wherein one of the second data lines comprises a second line segment, the second line segment overlapping with none of the compensation structures in the direction perpendicular to the plane of the display panel, and a width of the second line segment is greater than a width of one of the first data lines, in a direction perpendicular to an extending direction of one of the data lines; or wherein one of the second data lines comprises a third line segment, the third line segment not overlapping with one of the compensation structures in the direction perpendicular to the plane of the display panel, and the third line segment extending non-linearly.

* * * * *